(12) United States Patent
Jung et al.

(10) Patent No.: US 11,848,069 B2
(45) Date of Patent: Dec. 19, 2023

(54) PAGE BUFFER INCLUDING LATCHES AND MEMORY DEVICE INCLUDING THE PAGE BUFFER

(71) Applicant: SAMSUNG ELECTRONICS CO., LTD., Suwon-si (KR)

(72) Inventors: Keeho Jung, Suwon-si (KR); Sangwan Nam, Hwaseong-si (KR); Hyunggon Kim, Hwaseong-si (KR)

(73) Assignee: Samsung Electronics Co., Ltd.

( * ) Notice: Subject to any disclaimer, the term of this patent is extended or adjusted under 35 U.S.C. 154(b) by 59 days.

(21) Appl. No.: 17/718,070

(22) Filed: Apr. 11, 2022

(65) Prior Publication Data

US 2023/0129283 A1 Apr. 27, 2023

(30) Foreign Application Priority Data

Oct. 22, 2021 (KR) .................. 10-2021-0141923

(51) Int. Cl.
*G11C 7/00* (2006.01)
*G11C 7/10* (2006.01)
*G11C 7/06* (2006.01)
*G11C 7/12* (2006.01)

(52) U.S. Cl.
CPC ............ *G11C 7/1039* (2013.01); *G11C 7/065* (2013.01); *G11C 7/1057* (2013.01); *G11C 7/1084* (2013.01); *G11C 7/12* (2013.01)

(58) Field of Classification Search
CPC .................................................. G11C 7/1087
See application file for complete search history.

(56) References Cited

U.S. PATENT DOCUMENTS

| 7,307,890 | B2 | 12/2007 | Son |
| 7,508,732 | B2 | 3/2009 | Park et al. |
| 7,872,925 | B2 | 1/2011 | Lee et al. |
| 9,971,647 | B2 | 5/2018 | Michael |
| 10,825,526 | B1 | 11/2020 | Li et al. |
| 2013/0322171 | A1* | 12/2013 | Lee .................. G11C 29/04 365/185.03 |

FOREIGN PATENT DOCUMENTS

| KR | 101030146 | 4/2011 |
| KR | 101098431 | 12/2011 |

* cited by examiner

*Primary Examiner* — Hoai V Ho
(74) *Attorney, Agent, or Firm* — Fish & Richardson P.C.

(57) ABSTRACT

The memory device includes a page buffer circuit including a page buffer connected to each of a plurality of bit lines. The page buffer includes at least one additional latch and N number of data latches, and a control logic circuit that controls a setting of the page buffer. Based on a first setting, data programmed in a current program operation is stored in some of the N data latches and the at least one additional latch, and data which is to be programmed in a next program operation before the current program operation is completed is stored in some other of the N data latches and the at least one additional latches. Based on a second setting, externally provided data is not stored in the at least one additional latch in the current program operation and the next program operation.

20 Claims, 23 Drawing Sheets

FIG. 9

| F | A | PGM |
|---|---|---|
| 0 | 0 | Normal PGM |
| 1 | 0 | 1st Forcing PGM |
| 1 | 1 | 2nd Forcing PGM |

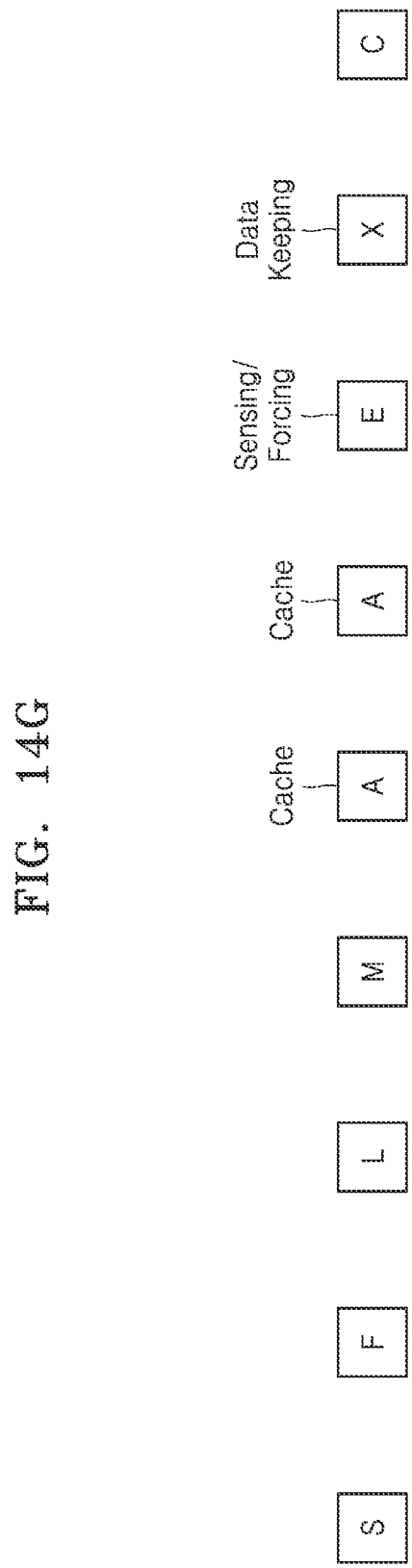

PAGE BUFFER INCLUDING LATCHES AND MEMORY DEVICE INCLUDING THE PAGE BUFFER

CROSS-REFERENCE TO RELATED APPLICATION

A claim of priority under 35 U.S.C. § 119 is made to Korean Patent Application No. 10-2021-0141923, filed on Oct. 22, 2021, in the Korean Intellectual Property Office, the entirety of which is hereby incorporated by reference.

BACKGROUND

The present disclosure relates to memory devices, and more particularly to page buffers including a plurality of latches and memory device including such page buffer.

Recently, as the multi-functionality of information communication devices has increased, there is need to increase the storage capacity and integration degree of memory devices. In order to store data in memory cells or output data from memory cells, memory devices may include a page buffer connected to bit lines of memory cells, and the page buffer may include one or more latches.

For example, a page buffer may include a plurality of latches which include a latch for temporarily storing record data and a latch for sensing data. However, there may be limitations with respect to enhancing various functions of memory devices because the plurality of latches included in the page buffer are not used efficiently.

SUMMARY

Embodiments of the inventive concepts provide a page buffer including an additional latch having a changeable function and a memory device including the page buffer, thereby enhancing the performance of various functions of the memory device on the basis of a setting of the memory device.

Embodiments of the inventive concepts provide a memory device including a memory cell array including a plurality of memory cells; a page buffer circuit including a page buffer connected to the memory cell array through a corresponding bit line from among a plurality of bit lines, the page buffer including at least one additional latch and N data latches that store data to be programmed, wherein N is an integer of 2 of more; and a control logic circuit that controls a setting of the page buffer. Based on a first setting corresponding to the page buffer, data programmed in a current program operation is stored in some data latches of the N data latches and the at least one additional latch, and data to be programmed in a next program operation is stored in other of the N data latches and the at least one additional latch before the current program operation is completed. Based on a second setting corresponding to the page buffer, externally provided data is not stored in the at least one additional latch in the current program operation and the next program operation.

Embodiments of the inventive concepts further provide a page buffer of a memory device, the page buffer including a sensing latch connected to a bit line through a sensing node and that senses data stored in a memory cell; a forcing latch connected to the bit line and that adjusts a precharge voltage level of the bit line; a first data latch and a second data latch that each store data to be programmed; a cache latch that receives data from an external memory controller and transfers the received data to the first data latch or the second data latch; and an additional latch that stores data to be programmed based on a first setting of the memory device, and that stores information for adjusting a precharge voltage level of the bit line or information representing a pass or a fail of programming of programmed data based on a second setting of the memory device.

Embodiments of the inventive concepts still further provide a memory device including a memory cell array including a plurality of memory cells; a page buffer circuit including a page buffer connected to the memory cell array through a corresponding bit line from among a plurality of bit lines, the page buffer including at least one additional latch and N data latches that store data to be programmed, wherein N is an integer of 2 or more; a control logic circuit that controls a program operation and a read operation on the memory cell array; a cache operation circuit that controls an electrical connection relationship so that the at least one additional latch operates as a cache temporarily storing data; a sensing/forcing operation circuit that controls an electrical connection relationship so that the at least one additional latch senses data stored in a memory cell or adjusts a precharge voltage level of the corresponding bit line; and a program data keeping circuit that controls an electrical connection relationship so that the at least one additional latch stores program pass/fail information and data on which current programming is performed is kept in the page buffer until a current program operation is completed. The control logic circuit outputs a control signal for controlling at least one of the cache operation circuit, the sensing/forcing operation circuit, and the program data keeping circuit based on setting information.

BRIEF DESCRIPTION OF THE DRAWINGS

Embodiments of the inventive concepts will be more clearly understood from the following detailed description taken in conjunction with the accompanying drawings in which:

FIGS. 9, 10A and 10B illustrate diagrams of an operation example of a case where an additional latch is used for forcing, in embodiments of the inventive concepts;

FIGS. 14A, 14B, 14C, 14D, 14E, 14F and 14G illustrate diagrams of an example where a page buffer includes a plurality of additional buffers, according to embodiments of the inventive concepts;

DETAILED DESCRIPTION OF THE EMBODIMENTS

Hereinafter, embodiments will be described in detail with reference to the accompanying drawings.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
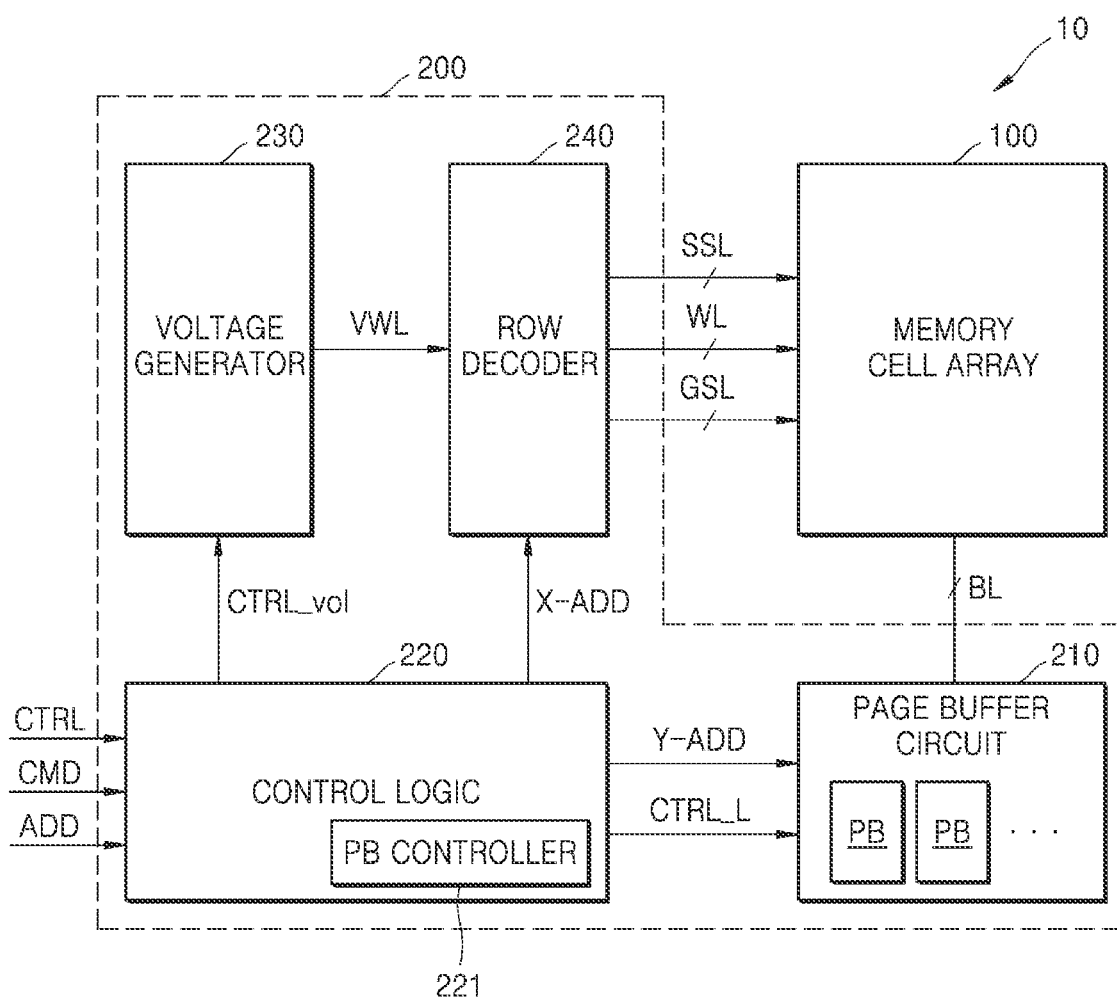
FIG. 1 illustrates a block diagram of a memory device according to embodiments of the inventive concepts.

FIG. 1 illustrates a block diagram of a memory device 10 according to embodiments of the inventive concepts.

Referring to FIG. 1, the memory device 10 may include a memory cell array 100 and a peripheral circuit 200. The peripheral circuit 200 may include a page buffer circuit 210, a control logic 220 (e.g., a control logic circuit), a voltage generator 230, and a row decoder 240. Although not shown in FIG. 1, the peripheral circuit 200 may further include various elements such as for example a data input/output (I/O) circuit, a column logic circuit, a pre-decoder, a temperature sensor, a command decoder, and an address decoder, among other circuits.

The memory cell array 100 may be connected to the page buffer circuit 210 through bit lines BL and may be connected to the row decoder 240 through word lines WL, string selection lines SSL, and ground selection lines GSL. The memory cell array 100 may include a plurality of memory cells, and for example, the memory cells may include flash memory cells. Hereinafter, a case where the plurality of memory cells includes NAND flash memory cells will be described as an example of embodiments. However, the inventive concepts are not limited thereto, and in some embodiments, the plurality of memory cells may include resistive memory cells such as resistive random memory (RAM) cells (i.e., ReRAM cells), phase change RAM (PRAM) cells, ferroelectric RAM cells (FRAM), and magnetic RAM (MRAM) cells.

The control logic 220 may output various control signals (for example, a voltage control signal CTRL_vol, a row address X-ADD, and a column address Y-ADD) for recording or programming data in the memory cell array 100, reading data from the memory cell array 100, or erasing data stored in the memory cell array 100 on the basis of a command CMD, an address ADD, and a control signal CTRL. Therefore, the control logic 220 may overall control various operations of the memory device 10.

The voltage generator 230 may generate various kinds of voltages VWL for performing a program operation, a read operation, and an erase operation on the memory cell array 100 on the basis of the voltage control signal CTRL_vol. In detail, the voltage generator 230 may generate a word line voltage (for example, a program voltage, a read voltage, a pass voltage, an erase verification voltage, or a program verification voltage). Also, the voltage generator 230 may further generate a string selection line voltage and a ground selection line voltage on the basis of the voltage control signal CTRL_vol. Also, the voltage generator 230 may generate one or more voltages for driving or controlling the page buffer circuit 210 according to embodiments.

In response to the row address X-ADD, the row decoder 240 may select one memory block from among a plurality of memory blocks, select one word line WL from among word lines WL of the selected memory block, and select one string selection line from among a plurality of string selection lines SSL. The page buffer circuit 210 may select some bit lines from among bit lines BL in response to the column address Y-ADD. In detail, the page buffer circuit 210 may operate as a write driver or a sense amplifier on the basis of an operation mode.

The pager buffer circuit 210 may include a plurality of page buffers PB connected to a plurality of bit lines BL. Each of the page buffers PB may be connected to a corresponding bit line BL among the plurality of bit lines BL. The page buffer circuit 210 may temporarily store data read from the memory cell array 100, or may temporarily store data which is to be programmed in the memory cell array 100.

The page buffer PB may include a plurality of latches including a latch temporarily storing data which is to be programmed in the memory cell array 100. As an implementation example, when a latch storing data which is to be programmed is referred to as a data latch, the page buffer PB may include a plurality of data latches for temporarily storing data of a plurality of bits. For example, when each memory cell is a triple level cell (TLC) storing 3-bit data, the page buffer PB may include at least three data latches for storing the 3-bit data.

According to example embodiments, the page buffer PB may further include a latch (hereinafter, referred to as an additional latch) for storing at least a portion of next data (for example, 3-bit data) which is to be programmed. For example, the page buffer PB may include one or more additional latches, and while current 3-bit data is being programmed, the additional latch may previously store at least a portion of next 3-bit data which is to be programmed.

Also, according to example embodiments, the use of the additional latch may be changed based on a setting operation of the memory device 10. For example, the control logic 220 may include a page buffer controller 221, and the page buffer controller 221 may store setting information associated with a use setting of the additional latch. The page buffer controller 221 may output the latch control signal CTRL_L for setting control on the page buffer PB on the basis of the setting information. Alternatively, the control logic 220 may control various operations associated with programming and reading data in the memory device 10 on the basis of the setting information stored in the page buffer controller 221, and for example, may adjust waveforms of various signals associated with programming and reading data on the basis of the use of the additional latch or may control various operations associated with storing data in the plurality of latches of the page buffer PB.

According to example embodiments, the additional latch may be set to be used for a purpose in addition to previously storing (or cache) next data which is to be programmed. For example, based on the setting operation, the additional latch may be used as a forcing latch for enhancing a characteristic of a threshold voltage distribution based on data programming, or may be used as a sensing latch used in a data sensing operation. Alternatively, based on the setting operation, the additional latch may be used for storing certain information so that currently programmed data is kept in the page buffer PB. For example, in program-passed data of currently programmed 3-bit data, a value of a latch may need to be set so that an additional program operation on corresponding data is inhibited, and in an embodiment, a value of a latch storing program-passed data may keep the storage of previous data, but the page buffer PB may operate so that information representing program pass or fail is stored in the additional latch.

According to an embodiment, various characteristics of the memory device 10 may be enhanced based on a setting operation, and for example, the additional latch may be used as a data cache so as to enhance performance such as a data program speed, or the additional latch may be used as a forcing latch so as to enhance a characteristic of a threshold voltage distribution, whereby the memory device 10 may be set for enhancing various characteristics of the memory device 10 on the basis of a system to which the memory device 10 is applied.

In embodiments of the inventive concepts, a TLC where 3-bit data is stored in each memory cell is described, but the embodiments are not limited thereto. For example, the embodiments may be applied to a case where a memory cell such as a quadruple level cell (QLC) storing a different number of bits is adopted.

The memory device 10 according to embodiments illustrated in FIG. 1 may be referred to as a storage device. For example, the storage device may be a device which stores data on the basis of control by a host device such as for example a computer, a smartphone, or a smart pad, or the like. The storage device may be a device which stores data in a semiconductor memory (particularly, a non-volatile memory device) such as a solid state drive (SSD) or a memory card. Although not shown in FIG. 1, the storage device may further include a controller which controls the memory device 10, and the controller may control a data storage operation or a data read operation on the memory device 10 on the basis of a request from the host device, and for example, may provide the memory device 10 with the command CMD, the address ADD, and the control signal CTRL described above.

Figure 2:
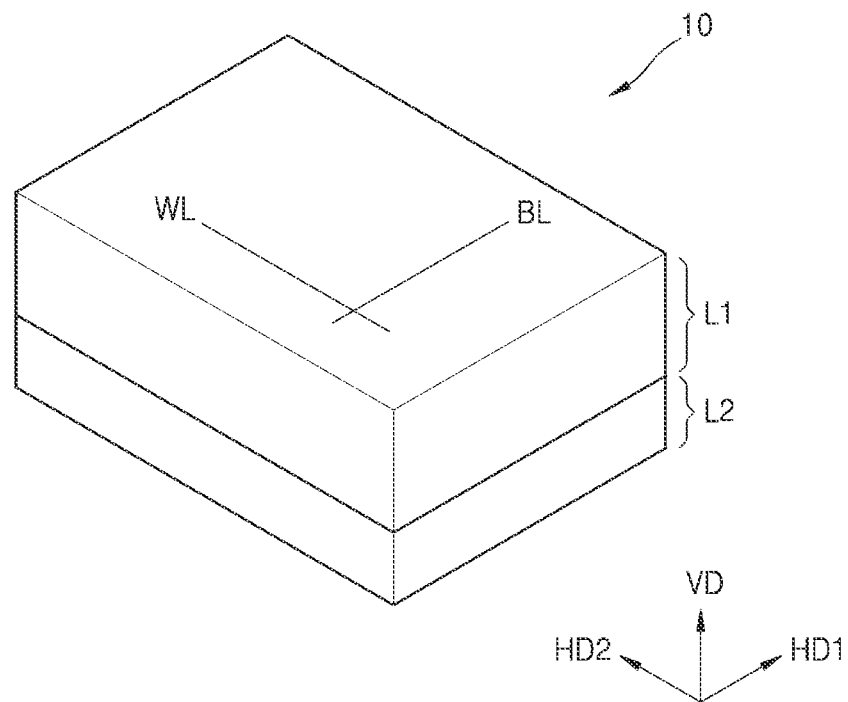
FIG. 2 illustrates a diagram schematically showing a structure of the memory device of FIG. 1.

FIG. 2 illustrates a diagram schematically showing a structure of the memory device 10 of FIG. 1. In FIG. 2, a cell over peripheral (COP) structure is illustrated as an implementation example of the memory device 10, but the embodiments are not limited thereto and the memory device 10 may be implemented based on various structures.

Referring to FIGS. 1 and 2, the memory device 10 may include a first semiconductor layer L1 and a second semiconductor layer L2, and the first semiconductor layer L1 may be stacked in a vertical direction VD with respect to the second semiconductor layer L2. In detail, the second semiconductor layer L2 may be disposed at a lower portion in a vertical direction VD with respect to the first semiconductor layer L1, and thus, may be disposed close to the substrate.

In an embodiment, the memory cell array 100 of FIG. 1 may be formed in the first semiconductor layer L1, and the peripheral circuit 200 of FIG. 1 may be formed in the second semiconductor layer L2. Therefore, the memory device 10 may have a structure (i.e., a COP structure) where the memory cell array 100 is disposed on the peripheral circuit 200. The COP structure may effectively reduce a horizontal-direction area and may enhance the degree of integration of the memory device 10.

In embodiments, the second semiconductor layer L2 may include a substrate, and transistors and metal patterns for wiring the transistors may be formed, whereby the peripheral circuit 200 may be formed in the second semiconductor layer L2. After the peripheral circuit 200 is formed in the second semiconductor layer L2, the first semiconductor layer L1 including the memory cell array 100 may be formed, and metal patterns for electrically connecting the word lines WL and the bit lines BL of the memory cell array 100 to the peripheral circuit 200 may be formed in the second semiconductor layer L2. For example, the bit lines BL may extend in a first horizontal direction HD1, and the word lines WL may extend in a second horizontal direction HD2.

Figure 3:
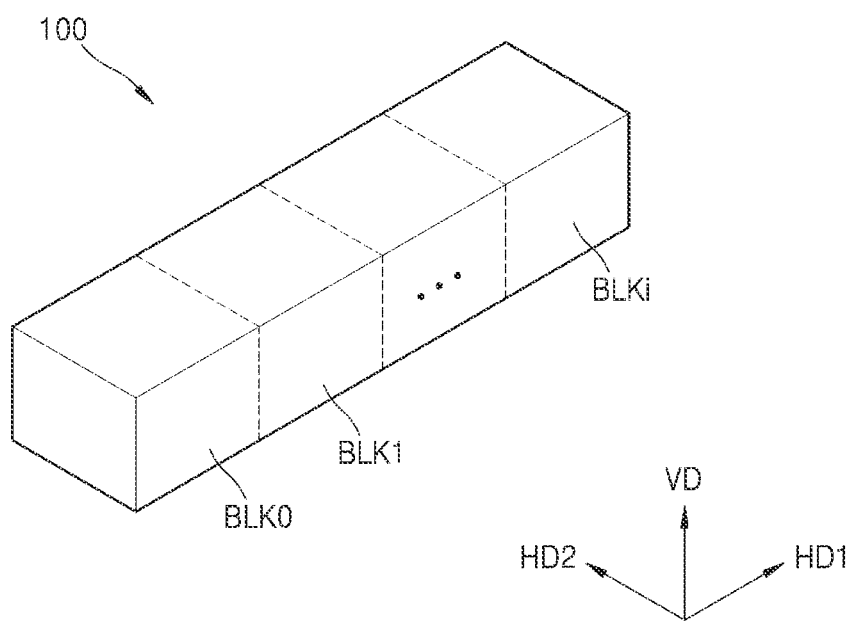
FIG. 3 illustrates a diagram of a memory cell array of FIG. 1, according to embodiments of the inventive concepts.

FIG. 3 illustrates a diagram of the memory cell array 100 of FIG. 1, according to embodiments of the inventive concepts.

Referring to FIGS. 1 to 3, the memory cell array 100 may include a plurality of memory blocks BLK0 to BLKi (where i is a positive integer). Each of the plurality of memory blocks BLK0 to BLKi may have a three-dimensional (3D) structure (or a vertical structure). In detail, each of the plurality of memory blocks BLK0 to BLKi may include a plurality of NAND strings extending in a vertical direction VD. In this case, the plurality of NAND strings may be provided apart from one another by a certain distance in first and second horizontal directions HD1 and HD2. The plurality of memory blocks BLK0 to BLKi may be selected by a row decoder (240 of FIG. 1). For example, the row decoder 240 may select a memory block corresponding to a block address from among the plurality of memory blocks BLK0 to BLKi.

Figure 4:
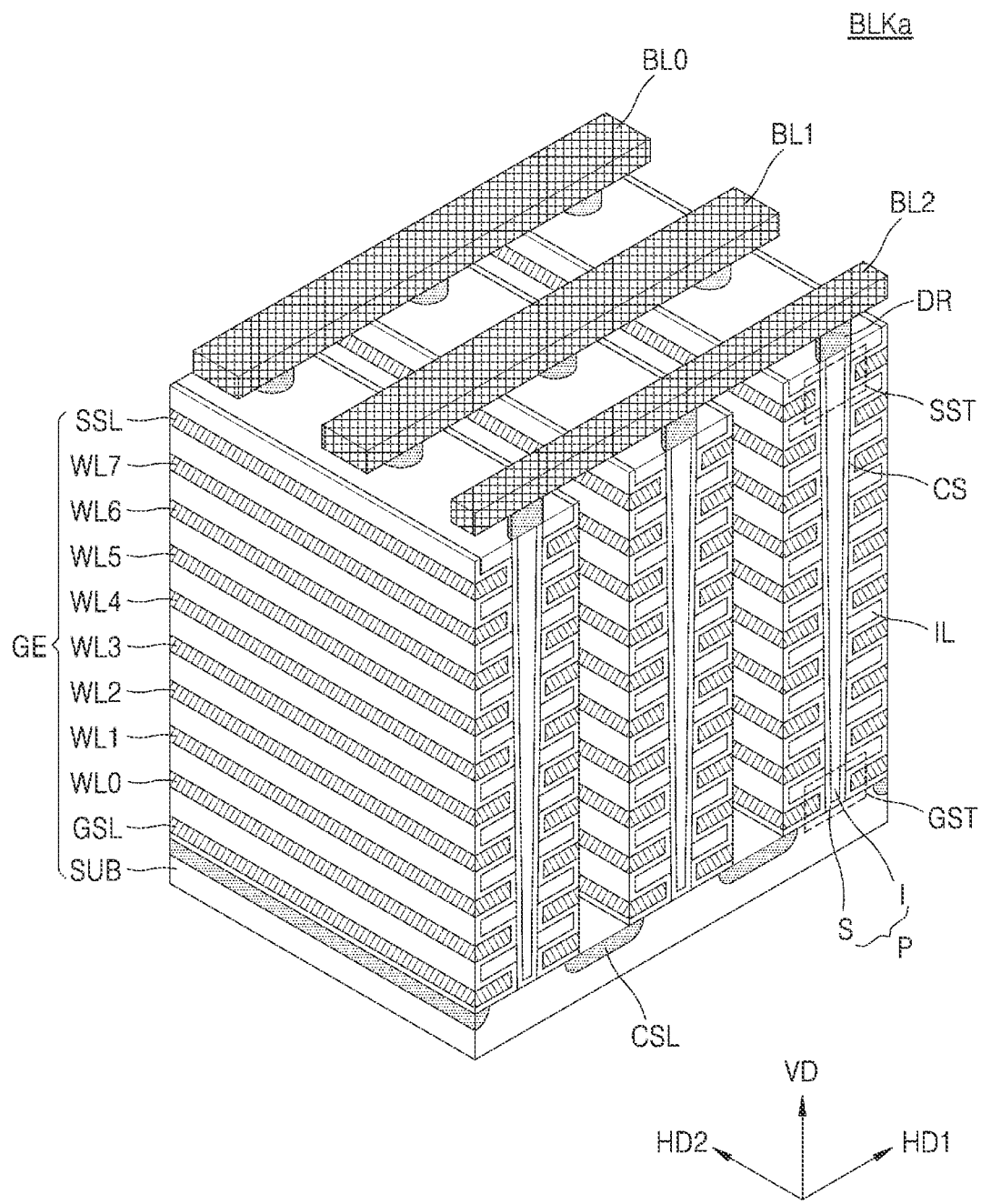
FIG. 4 illustrates a perspective view of a memory block of FIG. 3, according to embodiments of the inventive concepts.

FIG. 4 illustrates a perspective view of a memory block BLKa from among the memory blocks shown in FIG. 3, according to embodiments of the inventive concepts.

Referring to FIGS. 1 to 4, the memory block BLKa may be formed in a direction vertical to a substrate SUB. The substrate SUB may have a first conductive type (for example, a p type), and a common source line CSL, which extends in the second horizontal direction HD2 and is doped with impurities having a second conductive type (for example, an n type), may be provided on the substrate SUB. A plurality of insulation layers IL extending in the second horizontal direction HD2 may be sequentially provided in a vertical direction VD in a region of the substrate SUB between two adjacent common source lines CSL, and the plurality of insulation layers IL may be apart from one another by a certain distance in the vertical direction VD.

For example, the plurality of insulation layers IL may include an insulating material such as silicon oxide.

A plurality of pillars P, which are sequentially arranged in the first horizontal direction HD1 and pass through the plurality of insulation layers IL in the vertical direction VD, may be provided in a region of the substrate SUB between two adjacent common source lines CSL. For example, the plurality of pillars P may pass through the plurality of insulation layers IL and may contact the substrate SUB. In detail, a surface layer S of each of the plurality of pillars P may include a silicon material having a first type and may function as a channel region. An inner layer I of each pillar P may include an air gap or an insulating material such as silicon oxide.

A charge storage layer CS may be provided along the insulation layers IL, the pillars P, and an exposed surface of the substrate SUB, in a region between two adjacent common source lines CSL. The charge storage layer CS may include a gate insulation layer (e.g., referred to as a tunneling insulation layer), a charge trap layer, and a blocking insulation layer. For example, the charge storage layer CS may have an oxide-nitride-oxide (ONO) structure. Also, gate electrodes GE implemented as selection lines GSL and SSL and word lines WL0 to WL7 may be provided in a region between two adjacent common source lines CSL. As shown, the selection line GSL may function as a gate electrode of ground select transistor GST and the selection line SSL may function as a gate electrode of a string select transistor SST.

Drains or drain contacts may be respectively provided on the plurality of pillars P. For example, the drains or the drain contacts may include a silicon material doped with impurities having the second conductive type. Bit lines BL1 to BL3, which extend in the first horizontal direction HD1 and are disposed apart from one another by a certain distance in the second horizontal direction HD2, may be provided on the drains DR.

Figure 5:
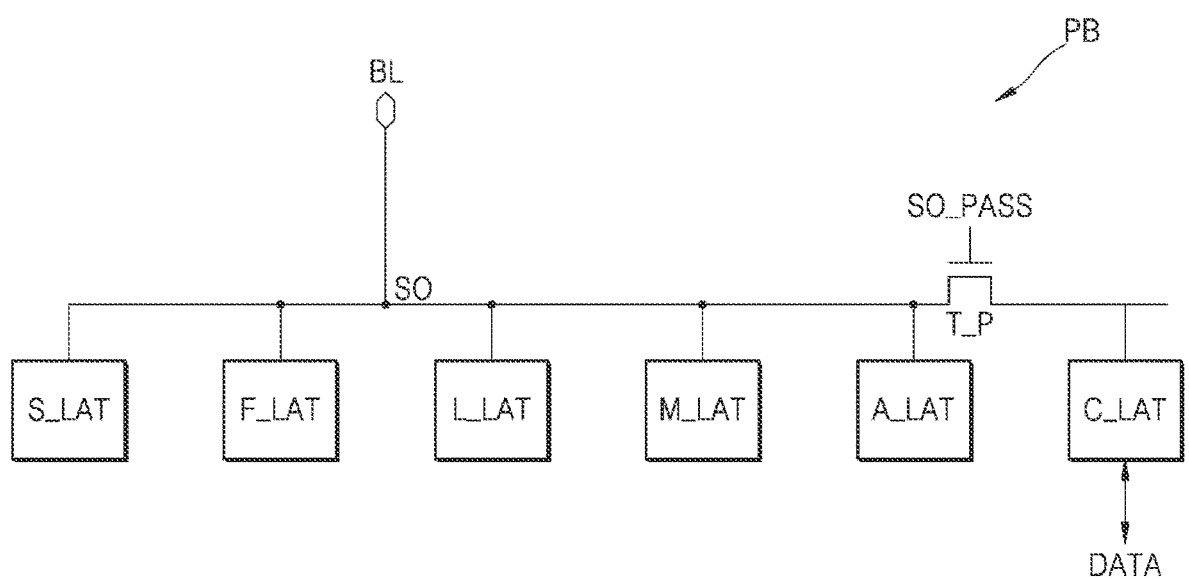
FIG. 5 illustrates a diagram of a page buffer according to embodiments of the inventive concepts.

FIG. 5 illustrates a diagram of a page buffer PB according to embodiments of the inventive concepts. In FIG. 5, a schematic configuration of the page buffer PB is shown, and illustration of various transistors disposed between a bit line BL and latches is omitted.

Referring to FIG. 5, the page buffer PB may include a cache latch C_LAT, and the cache latch C_LAT may receive and store data DATA which is to be programmed in a memory cell. Also, the cache latch C_LAT may be electrically connected to other latches of the buffer PB through a pass transistor T_P, and the pass transistor T_P may be turned on or off based on a pass signal SO_PASS. When the pass transistor T_P is turned on, data DATA may be transferred between the cache latch C_LAT and the other latches.

The page buffer PB may include a plurality of latches connected to a sensing node SO, and for example, the page buffer PB may further include a sensing latch S_LAT, a force latch F_LAT, a first latch (or a lower bit latch L_LAT), a second latch (or an upper bit latch M_LAT), and an additional latch A_LAT. In an embodiment illustrated in FIG. 5, one additional latch A_LAT is illustrated, but according to embodiments, a plurality of additional latches may be included in the page buffer PB.

In a read or program verification operation, the sensing latch S_LAT may store data stored in a memory cell or a sensing result of a threshold voltage of the memory cell. Also, the force latch F_LAT may be used for improving a threshold voltage distribution in a program operation, and for example, may be used to adjust a precharge level of a corresponding bit line BL. For example, a voltage level precharged in a corresponding bit line BL may vary based on a value stored in the force latch F_LAT, and a variation amount of a threshold voltage of a memory cell connected to the bit line BL may be adjusted by a program operation. Also, for example, in a case where 3-bit data is stored in one memory cell, 3-bit data which is to be programmed currently may be stored in the first latch L_LAT, the second latch M_LAT, and the cache latch C_LAT in a program operation. Also, the first latch L_LAT, the second latch M_LAT, and the cache latch C_LAT which store currently programmed data may be referred to as a data latch. The page buffer PB may thus include at least one additional latch A_LAT, and N data latches (e.g., the first latch L_LAT, the second latch M_LAT, and the cache latch C_LAT) wherein N is an integer of 2 or more.

According to embodiments, in a case where the additional latch A_LAT is used as a data cache, one bit of 3-bit data which is to be programmed next may be provided to the page buffer PB and stored in the additional latch A_LAT in a current program operation. For example, a memory cell disposed in a word line or a block which differs from a currently programmed memory cell may be connected to the page buffer PB, and programming may be performed by using data which is stored in the page buffer PB and is to be programmed next. Also, because the additional latch A_LAT is used as a data cache, all bits of 3-bit data which is to be programmed next may be stored in the page buffer PB before a current program operation is completed, and thus, a function of a full cache may be implemented. For example, a program operation on data stored in one of the first latch L_LAT, the second latch M_LAT, and the cache latch C_LAT may be completed in a current program operation, and thus, one other bit of the 3-bit data which is to be programmed next may be further stored in the page buffer PB. For example, when programming of data stored in the first latch L_LAT is completed, one bit which is to be programmed next may be further stored in the page buffer PB.

Also, when a program operation on data stored in one other latch (for example, the second latch M_LAT) is completed as a current program operation is performed, one other bit of the 3-bit data to be programmed next may be further stored in the page buffer PB. Therefore, all of 3-bit data associated with next programming may be previously stored in the page buffer PB in a current program operation.

In association with an operation of the page buffer PB, the cache latch C_LAT may receive data from the outside, the received data may be dumped into the first latch L_LAT, the second latch M_LAT, and the additional latch A_LAT, and moreover, programming of data stored in the first latch L_LAT, the second latch M_LAT, and the additional latch A_LAT may be performed in an arbitrary order. Therefore, 3-bit data which is currently programmed may be stored in the first latch L_LAT, the second latch M_LAT, and the additional latch A_LAT, and when 1-bit data to be programmed next is provided to the page buffer PB, data previously stored in the cache latch C_LAT may be dumped into the additional latch A_LAT, and the cache latch C_LAT may store 1-bit data which is to be programmed next. Also, when programming of one bit is completed in a current program operation, data currently stored in the cache latch C_LAT may be dumped into a latch on which the programming is completed, and one other bit which is newly provided and is to be programmed next may be stored in the cache latch C_LAT. Also, a full cache function may be implemented based on an operation described above, and 3-bit data to be programmed next may be stored in the page buffer PB.

An example associated with storing of data described above is an example embodiment, and the inventive concepts are not limited thereto. For example, based on various connection relationships in the page buffer PB, currently programmed data and data to be programmed next may be stored in various latches in the page buffer PB in various forms. For example, currently programmed data and data to be programmed next may be simultaneously stored in the page buffer PB, the currently programmed data may be stored in some latches, and the data to be programmed next may be stored in some other latches.

According to embodiments of the inventive concepts, based on a setting operation of a memory device, the additional latch A_LAT may be used for sensing/forcing, or may be used for various purposes of keeping program data.

Figure 6:
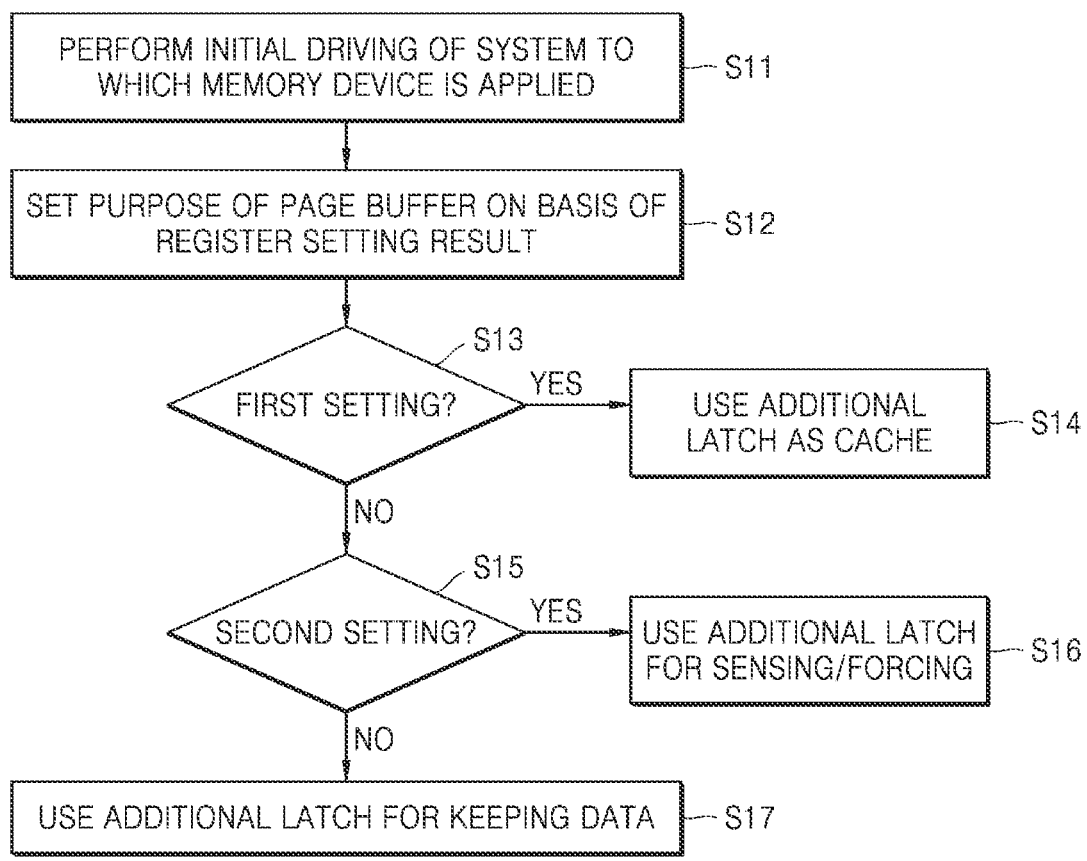
FIG. 6 illustrates a flowchart of an operating method of a memory device, according to embodiments of the inventive concepts.

FIG. 6 illustrates a flowchart of an operating method of a memory device, according to embodiments of the inventive concepts.

Referring to FIG. 6, the memory device may be applied to various electronic systems, and it may be required to enhance characteristics of various functions on the basis of the kinds of applied systems. Therefore, a fusing option or a register setting function for enabling various settings associated with a page buffer may be applied in a process of manufacturing the memory device, and a setting may be fixed and applied to a system, or a setting operation in the memory device may be performed during powering on of the system.

When a case which is based on a register setting during powering on the system is assumed, initial driving of the system to which the memory device is applied may be performed in operation S11, and the purpose of an additional latch included in a page buffer may be set based on a register setting result in operation S12. For example, the setting information may be stored in the memory device in a non-volatile manner and may be loaded into the register during initial driving, and a purpose setting operation may be performed based on the loaded setting information.

When the purpose of the additional latch of the memory device corresponds to a first setting on the basis of the setting operation in operation S13 (e.g., Yes in S13), the additional latch may be used as a cache according to the embodiments described above, and thus, a full cache function (e.g., storing a bit to be programmed next) may be implemented in data programming in operation S14. On the other hand, when the purpose of the additional latch does not correspond to the first setting (e.g., No in S13) and instead corresponds to a second setting in operation S15 (e.g., Yes in S15), the additional latch may be used for sensing/forcing purpose in operation S16, and thus data reliability may be enhanced in a data read operation, or a characteristic of a threshold voltage distribution may be improved in a data program operation. On the other hand, when the purpose of the additional latch does not correspond to the second setting (e.g., No in S15), the additional latch may be used for other purposes in operation S17. For example, when the additional latch is used for keeping data in operation S17, currently programmed data may be kept until a program operation is completed in the page buffer, whereby another storage space (for example, a storage circuit of a memory controller) for keeping currently programmed data may be reduced or may not be needed.

Figure 7A:
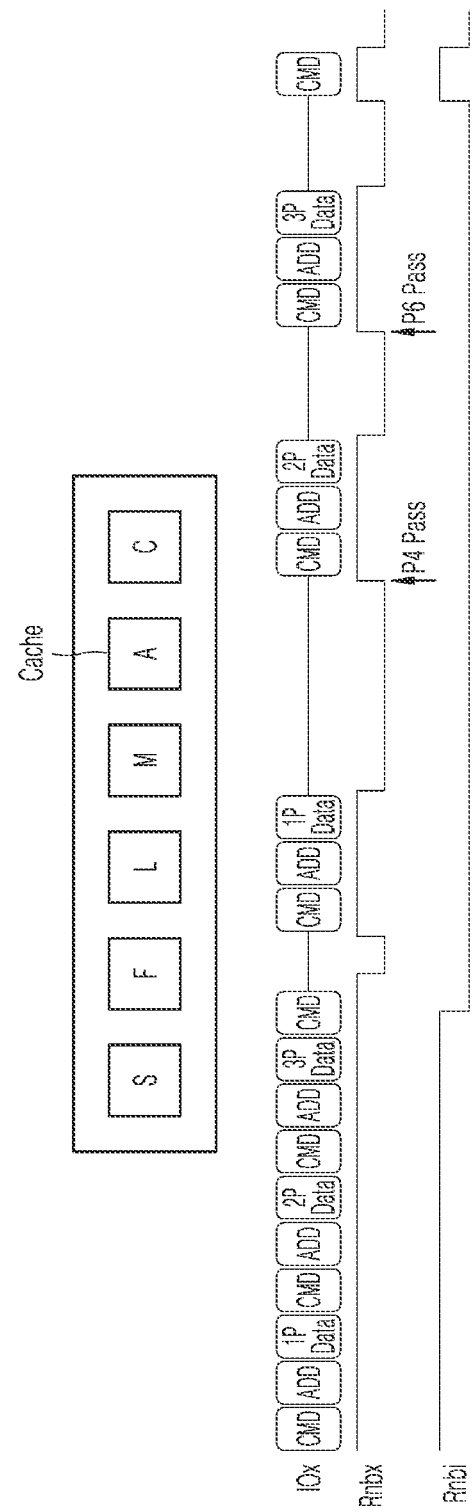
FIGS. 7A and 7B illustrate diagrams of an operation example of a case where an additional latch is used as a cache, in embodiments of the inventive concepts.
Figure 7B:
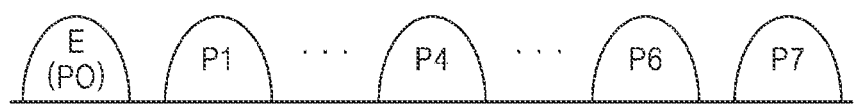

Hereinafter, an example where a page buffer connected to each bit line includes six latches will be described as an example of embodiments. FIGS. 7A and 7B are diagrams illustrating an operation example of a case where an additional latch is used as a cache, according to embodiments of the inventive concepts.

Referring to FIGS. 7A and 7B, a memory device may transmit or receive various signals to or from a memory controller (not shown) or a host, receive a command CMD, an address ADD, and data from the memory controller through an I/O line IOx, and may output a ready/busy signal Rnbx to the memory controller. Also, the memory device may generate an internal ready/busy signal Rnbi. When 3-bit data is stored in one memory cell (or when 3-page data is provided to a page buffer circuit), first to third data 1P Data to 3P Data may be received, and when the reception of the first to third data 1P Data to 3P Data is completed, a command CMD representing this may be provided to the memory device.

The memory device may receive the command CMD, the address ADD, and the data from the memory controller while the ready/busy signal Rnbx having a logic high state (or representing a ready state) is being provided to the memory controller and may generate the internal ready/busy signal Rnbi representing that an internal state of the memory device is a busy state while an internal program operation is being performed. In an embodiment illustrated in FIG. 7A, an example is illustrated where the internal ready/busy signal Rnbi maintains a logic low state while the first to third data 1P Data to 3P Data to be programmed currently are being programmed.

According to an embodiment, an additional latch A may be used as a cache for full caching of data, and thus, the ready/busy signal Rnbx having a logic high state may be provided to the memory controller while current programming is being performed and the first data 1P Data to be programmed next may be provided to the page buffer. For example, the ready/busy signal Rnbx having a logic high state may be provided to the memory controller immediately after current programming starts, and the first data 1P Data to be programmed next may be provided to the page buffer.

Also, as illustrated in FIG. 7B, when 3-bit data is stored in each memory cell, memory cells may include eight threshold voltage distributions P0 to P7, and the threshold voltage distribution P0 may correspond to an erase-state distribution E. Also, the threshold voltage distributions P0 to P7 may be sequentially programmed as a program operation is performed, and a case, where programming of a certain threshold voltage distribution (for example, P4) is completed, may represent a case where programming of one (for example, data stored in a first latch L) of pieces of data to be programmed currently is completed. Therefore, after programming of the threshold voltage distribution P4 is completed, the memory device may provide the memory controller with the ready/busy signal Rnbx having a logic high state while current programming is being performed, and the page buffer may receive and store the second data 2P Data which is to be programmed next. Also, after the second data 2P Data to be programmed next is received, the ready/busy signal Rnbx may be changed to a logic low state again.

Similarly, a case, where programming of another certain threshold voltage distribution (for example, P6) is completed, may represent a case where programming of one (for example, data stored in a second latch M) of the pieces of data to be programmed currently is completed. Therefore, after programming of the threshold voltage distribution P6 is completed, the memory device may provide the memory controller with the ready/busy signal Rnbx having a logic high state while current programming is being performed, and the page buffer may receive and store the third data 3P Data which is to be programmed next. Based on the operation, the first to third data 1P Data to 3P Data to be programmed next may be received while a current program operation is being performed, and thus, a full cache function may be implemented.

Figure 8:
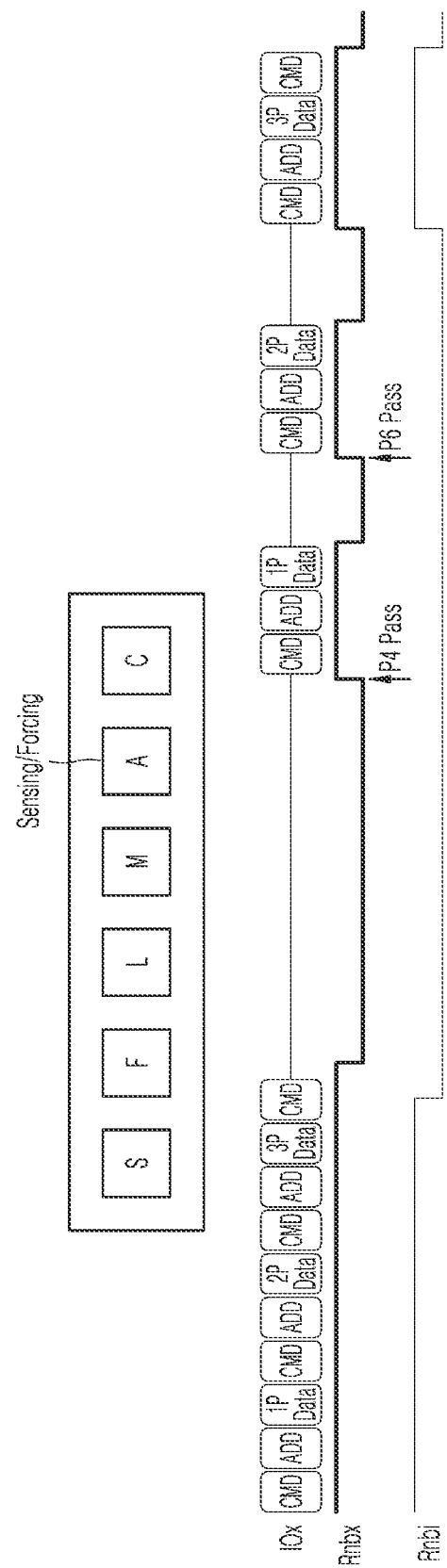
FIG. 8 illustrates a diagram of an operation example of a case where an additional latch is used for sensing/forcing, in embodiments of the inventive concepts.

FIG. 8 illustrates a diagram of an operation example of a case where an additional latch A is used for sensing/forcing, according to embodiments of the inventive concepts.

Referring to FIG. 8, the additional latch A may be used for the sensing purpose or the forcing purpose on the basis of a setting of a memory device, and thus, data to be programmed next may not be stored in the additional latch A. For example, in association with the reliability of read data, the additional latch A may be used in a sensing operation performed on data. For example, a plurality of read operations may be performed on the same memory cell, and at this time, data sensed in one read operation may be stored in a sensing latch S and data sensed in one other read operation may be stored in the additional latch A. Also, a value of data stored in a memory cell may be determined based on the data stored in the sensing latch S and the data stored in the additional latch A.

Alternatively, the additional latch A may be used for the forcing purpose of enhancing a threshold voltage distribution characteristic on the basis of a setting of the memory device, and a level of a voltage precharged into a bit line corresponding to a value stored in the additional latch A may vary. For example, a precharge level may be changed to various values on the basis of the value stored in the additional latch A and a value stored in a forcing latch F, and thus, a level of a threshold voltage of a programmed memory cell may be precisely adjusted and a threshold voltage distribution characteristic may be enhanced.

An example of an operation in a case where the additional latch A is used for sensing/forcing will be described below.

The memory device may receive a command CMD, an address ADD, and data from the memory controller and may output the ready/busy signal Rnbx to the memory controller. First to third data 1P Data to 3P Data to be programmed currently may be stored in the first latch L, the second latch M, and the cache latch C, and as reception of the first to third data 1P Data to 3P Data is completed, the ready/busy signal Rnbx may be changed to a logic low state. Also, an internal ready/busy signal Rnbi may maintain a logic low state while the received first to third data 1P Data to 3P Data are being programmed.

Also, as in the embodiment described above, after programming of the threshold voltage distribution P4 is completed, the memory device may provide the memory controller with the ready/busy signal Rnbx having a logic high state while current programming is being performed and may receive the first data 1P Data, which is to be programmed next, from the memory controller. Therefore, after programming of the threshold voltage distribution P6 is completed, the memory device may provide the memory controller with the ready/busy signal Rnbx having a logic high state while current programming is being performed and may receive the second data 2P Data which is to be programmed next. Therefore, the first data 1P Data and the second data 2P Data which are to be programmed next may be received while a current program operation is being performed, but the third data 3P Data to be programmed next may be received after the current program operation ends.

Figure 10A:
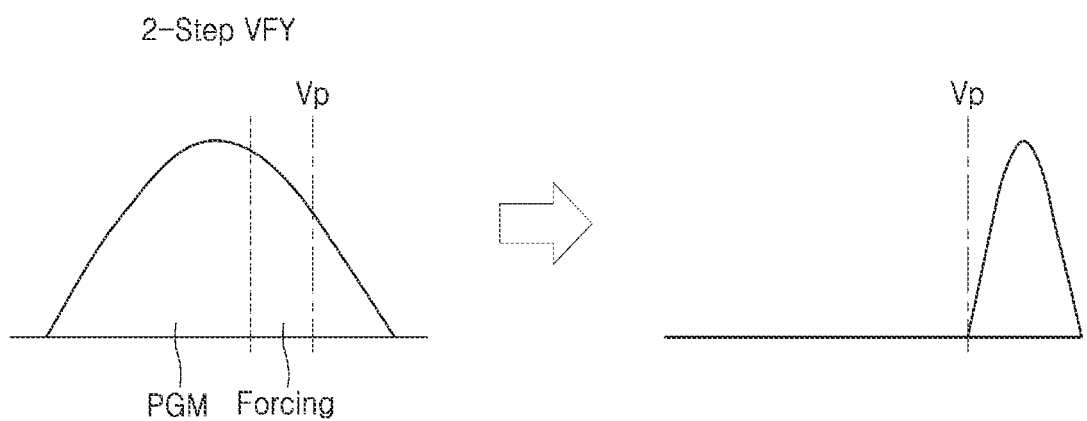
Figure 10B:
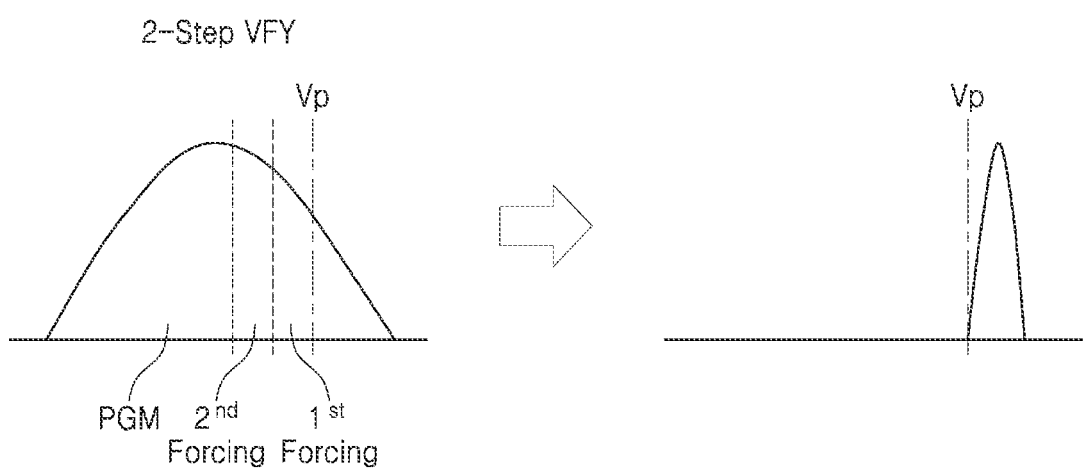

FIGS. 9, 10A and 10B illustrate diagrams of an operation example of a case where an additional latch is used for forcing, according to embodiments of the inventive concepts.

Referring to FIGS. 9 and 10, a voltage level precharged into a corresponding bit line may vary based on a value stored in an additional latch A and a value stored in a forcing latch F, and thus, a level of a threshold voltage of a memory cell on which programming is to be performed may be precisely adjusted based on the value stored in the additional latch A and the value stored in the forcing latch F. For example, as shown in FIG. 10A, assuming that a level of a threshold voltage is programmed to a certain voltage Vp or more, in a case where a precharge operation is performed by using only the forcing latch F, one program operation of a normal program operation and a forcing program operation may be selectively performed based on the value stored in the forcing latch F on the basis of 2-step verification (2-step VFY). On the other hand, as shown in FIG. 10B, in a case where the value stored in the additional latch A and the value stored in the forcing latch F are used in a precharge operation according to embodiments of the inventive concepts, one program operation of the normal program operation, a first forcing program operation, and a second forcing program operation may be selectively performed based on 3-step verification (3-step VFY).

Based on the operation described above, in a memory cell where a level of a threshold voltage is relatively low (for example, a first level range), an increase amount of the threshold voltage level of the memory cell may increase by applying the normal program operation. On the other hand, in a memory cell where a level of a threshold voltage has a second level range which is greater than the first level range, an increase amount of the threshold voltage level of the memory cell may decrease compared to the normal program operation by applying the second program operation. Also, in a memory cell where a level of a threshold voltage has a third level range which is greater than the second level range, an increase amount of the threshold voltage level of the memory cell may decrease compared to the second forcing program operation by applying the first program operation.

According to the embodiment described above, as the forcing program operation is performed by using the forcing latch F and the additional latch A, a width of a threshold voltage after a program operation is completed may be more narrow than FIG. 10A, and thus, a threshold voltage distribution characteristic may be enhanced.

In the embodiment illustrated in FIG. 9, a case is described where various values associated with the forcing program operation are stored in the forcing latch F and the additional latch A on the basis of a control logic of the memory device. For example, the normal program operation may be performed on a memory cell corresponding to a case where 0 is stored in the forcing latch F and the additional latch A. Also, the first forcing program operation may be performed on a memory cell corresponding to a case where 1 is stored in the forcing latch F and 0 is stored in the additional latch A. Also, the second forcing program operation may be performed on a memory cell corresponding to a case where 1 is stored in the forcing latch F and the additional latch A. However, the features illustrated in FIG. 9 relates to one example embodiment, and in other example embodiments the values stored in the forcing latch F and the additional latch A may be variously set for performing a plurality of forcing program operations.

Figure 11:
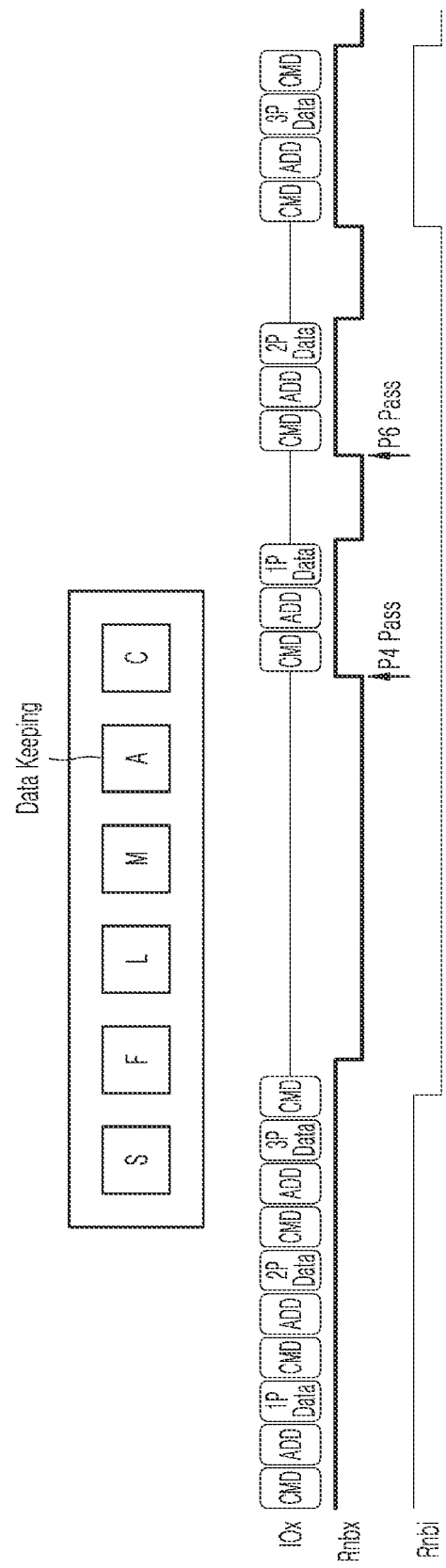
FIG. 11 illustrates a diagram of an operation example of a case where an additional latch is used for keeping data, in embodiments of the inventive concepts.

FIG. 11 illustrates a diagram of an operation example of a case where an additional latch A is used for keeping data, according to embodiments of the inventive concepts. Referring to FIG. 11, like the embodiment illustrated in FIG. 8, data to be programmed next may not be stored in the additional latch A, and thus, a process of programming first to third data 1P Data to 3P Data may be performed like the embodiment illustrated in FIG. 8. For example, the first to third data 1P Data to 3P Data to be programmed next may be stored in a first latch L, a second latch M, and a cache latch C, and only some of pieces of data to be programmed next may be provided to a page buffer while the stored first to third data 1P Data to 3P Data are being programmed. For example, the first data 1P Data to be programmed next may be received after programming of a threshold voltage distribution P4 is completed, the second data 2P Data to be programmed next may be received after programming of a threshold voltage distribution P6 is completed, and the third data 3P Data of pieces of data to be programmed next may be received after a current program operation ends.

Figure 12A:
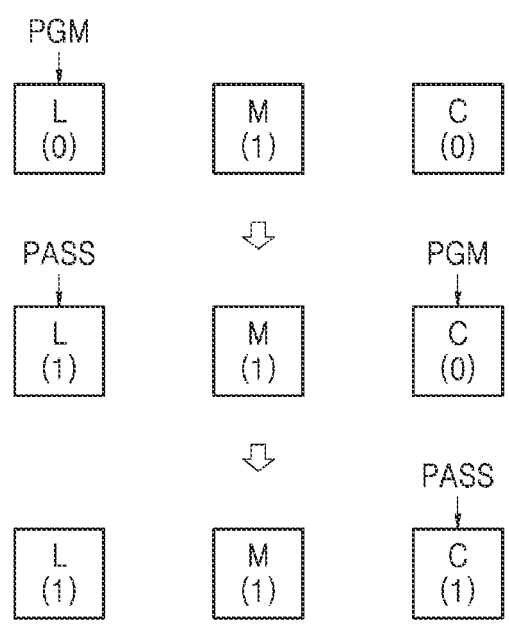
FIGS. 12A and 12B illustrate diagrams of an operation example of a memory device in a case where an additional latch is used for keeping data, in embodiments of the inventive concepts.
Figure 12B:
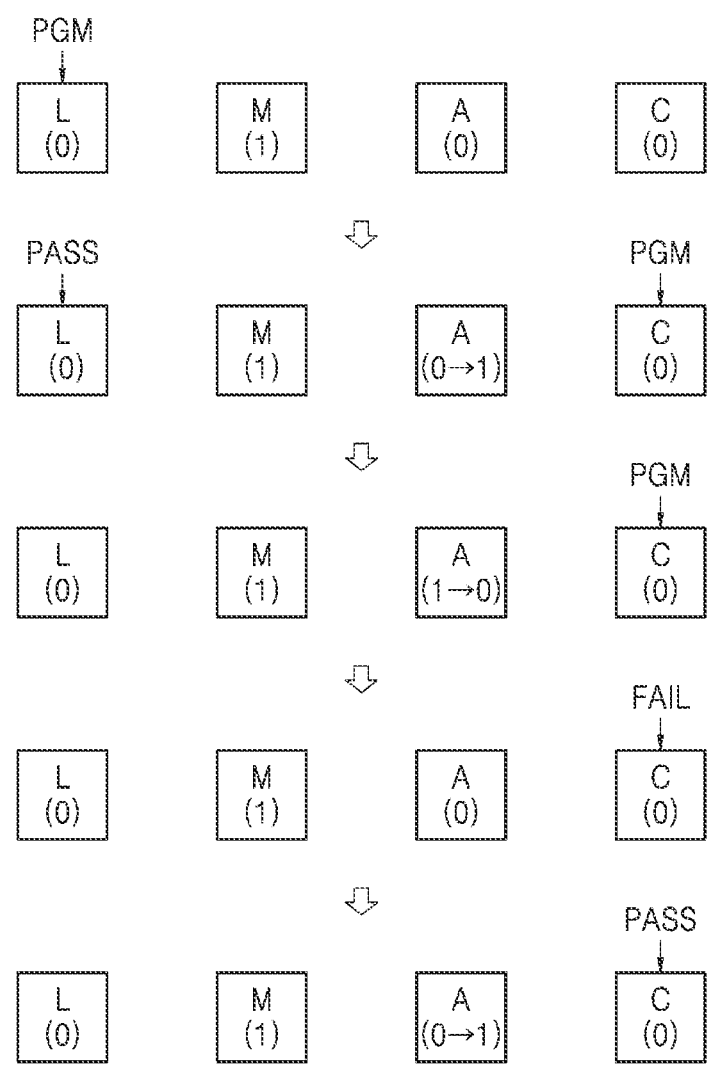

FIGS. 12A and 12B illustrate diagrams of an operation example of a memory device in a case where an additional latch is used for keeping data, according to embodiments of the inventive concepts. FIG. 12A illustrates an operation example of a case where an additional latch is not used FIG. 12B illustrates an operation example of a case where an additional latch is used for keeping data according to embodiments of the inventive concepts. Also, a case is illustrated where first to third data 1P Data to 3P Data to be programmed currently are stored in a first latch L, a second latch M, and a cache latch C, 0 is stored in the first latch L and the cache latch C, and 1 is stored in the second latch M.

Referring to FIG. 12A, data of a latch storing a value of 0 among the first latch L, the second latch M, and the cache latch C may be selectively programmed in a memory cell. For example, when data of 0 is stored in a data latch, a real program operation of varying (or increasing) a threshold voltage of a memory cell may be performed, but when data of 1 is stored in the data latch, an operation of varying the threshold voltage through programming may not be performed. Also, when it is determined that programming of the data of 0 stored in the data latch is a pass through a verify operation, a value stored in the data latch may be changed to 1 so that an additional program operation is not performed on a corresponding memory cell.

For example, programming of the first latch L may be performed, and when it is determined that programming of data of the first latch L is a pass, a value of the first latch L may be changed to 1. Also, when it is determined that programming of data of the cache latch C is a pass, a value of the cache latch C may be changed to 1.

According to the embodiment illustrated in FIG. 12A, currently programmed data may be kept in a memory device or a system including the same until programming is completed, so that data that is not normally programmed in a process of programming data may be available to be correctly programmed or so that data may be reprogrammed under a condition such as sudden power off. For example, a memory controller or the memory device may include an additional storage circuit (for example, DRAM or SRAM) for storing currently programmed data, and thus, there may be a problem where the cost for implementing the memory device and the system including the same increases.

Referring to FIG. 12B, according to embodiments of the inventive concepts, an additional latch A may be used for keeping data, and thus, currently programmed data may be kept in a page buffer instead of in the additional storage circuit of the memory controller or the memory device. That is, in example embodiments, because currently programmed data may be kept in the page buffer until a program operation is completed, the size of the additional storage circuit (e.g., DRAM or SRAM) may be reduced.

For example, when programming of the first latch L is performed and programming of data of the first latch L is determined to be a pass, a value of the additional latch A may be changed to 1, so that it may be indicated that the data of the first latch has been successfully programmed. Further, data of 0 stored in the first latch L may be continuously kept. As a value of the additional latch A is changed to 1, reprogramming performed on a memory cell on which programming is passed may be inhibited.

Also, a value of the additional latch A may be again changed to 0 after programming of the first latch L is completed, and programming of data of the cache latch C may be performed. When a fail occurs in a program process performed on data of the cache latch C, a value of the additional latch A may be maintained as 0, and then, when it is determined that programming of data of the cache latch C is a pass through an additional program operation subsequent thereto, a value of the additional latch A may be changed to 1 and the data of the cache latch C may be maintained as 0.

According to the embodiment described above, data on which current programming is to be performed may be kept in the page buffer while programming of data is being performed without needing a separate storage circuit, reprogramming may be performed by using data kept in the page buffer under various conditions such as sudden power off, thereby enhancing the reliability of data.

Figure 13:
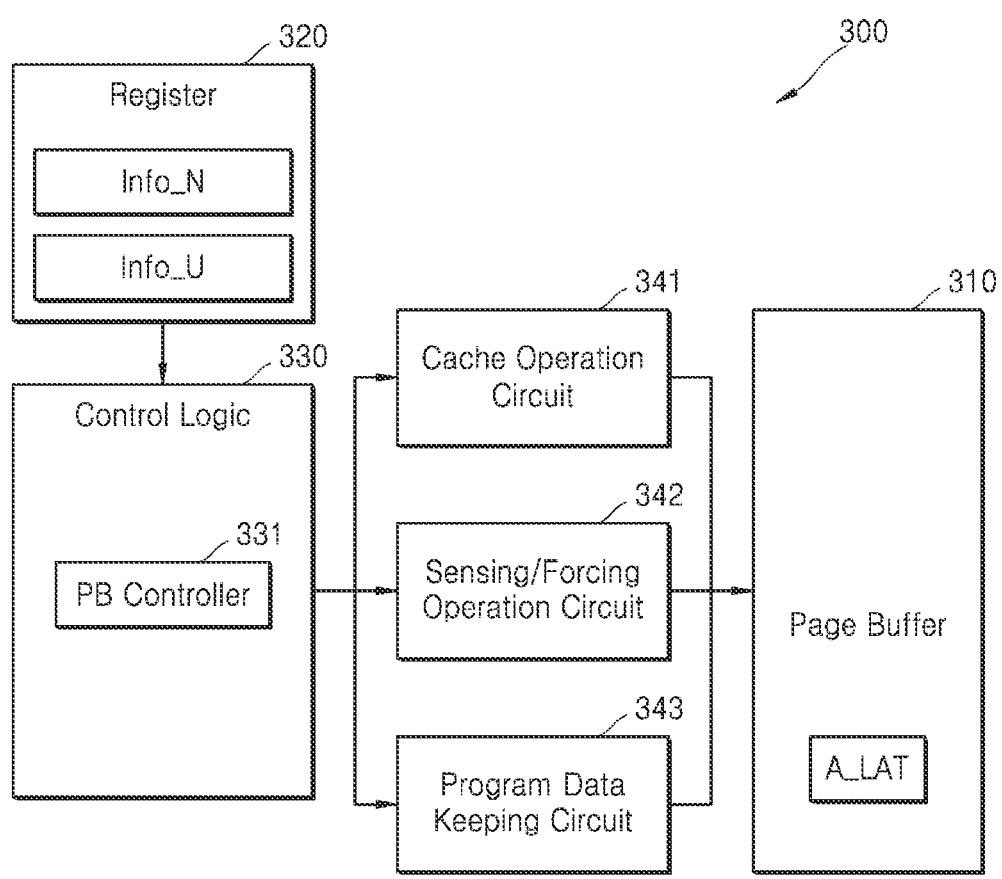
FIG. 13 illustrates a block diagram of a memory device according to embodiments of the inventive concepts.

FIG. 13 illustrates a block diagram of a memory device 300 according to embodiments of the inventive concepts.

Referring to FIG. 13, the memory device 300 may include a page buffer 310 connected to a bit line (not shown) and various elements associated with control of the page buffer 310. For example, the page buffer 310 may include at least one additional latch A_LAT according to the embodiments described above.

According to example embodiments, the memory device 300 may include a register 320, a control logic 330 (e.g., a control logic circuit), a cache operation circuit 341, a sensing/forcing operation circuit 342, and a program data keeping circuit 343. Also, the control logic 330 may include a page buffer controller 331.

First information Info_N associated with the number of latches included in the page buffer 310, and second information Info_U associated with the purpose of the additional latch A_LAT may be stored in the register 320. According to embodiments, the first information Info_N and the second information Info_U may be stored in the memory device 300 in a non-volatile manner during a process of manufacturing the memory device 300, and the first information Info_N and second information Info_U stored in the non-volatile manner may be loaded into the register 320 during a process of powering on the memory device 300.

During a power-on or initial operation of the memory device 300, the control logic 330 may control a setting operation performed on the page buffer 310 on the basis of the first information Info_N and second information Info_U. For example, the page buffer controller 331 may determine the number and purpose of additional latches A_LAT included in the page buffer 310 on the basis of the first information Info_N and second information Info_U, and may control the cache operation circuit 341, the sensing/ forcing operation circuit 342, and the program data keeping circuit 343 on the basis of the determination.

Each of the cache operation circuit 341, the sensing/forcing operation circuit 342, and the program data keeping circuit 343 may perform an operation associated with the page buffer 310 so that the additional latch A_LAT may be used for various purposes, according to embodiments of the inventive concepts. For example, when the additional latch A_LAT is used as a cache, the cache operation circuit 341 may control an electrical connection relationship so that data provided from the outside is stored in the additional latch A_LAT. Also, when the additional latch A_LAT is used for sensing/forcing, the sensing/forcing operation circuit 342 may control an electrical connection relationship so that the additional latch A_LAT latches a voltage of a sensing node in a data read operation, or various forcing programming is performed in a data program operation. Also, the program data keeping circuit 343 may control an electrical connection relationship so that a value stored in the additional latch A_LAT varies based on the pass/fail or not of data programming, according to the embodiments described above.

Figure 14A:
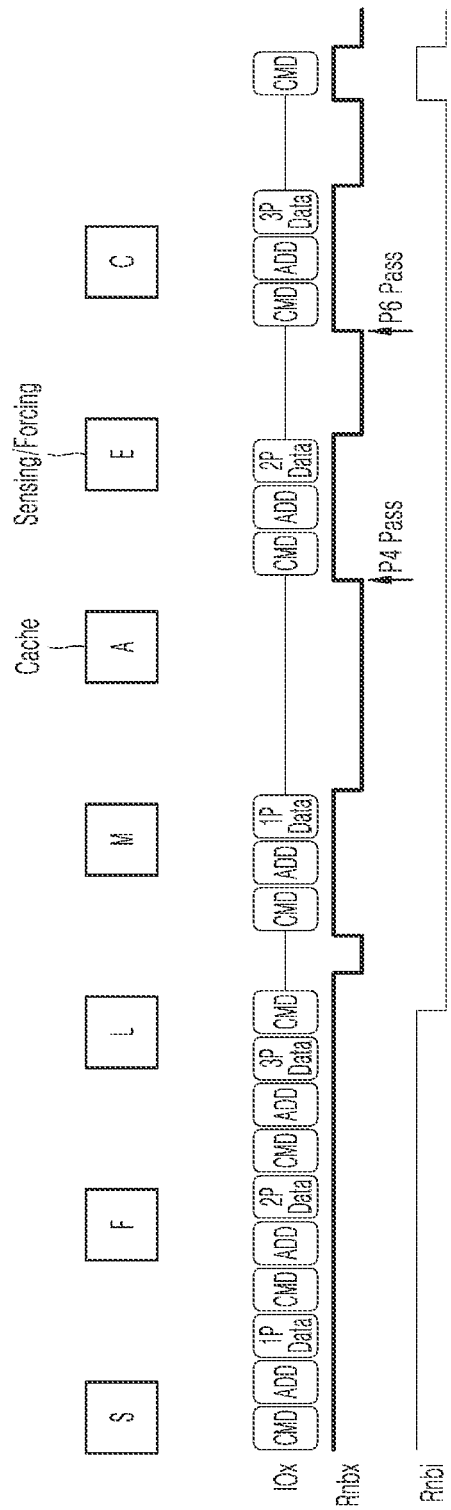
Figure 14B:
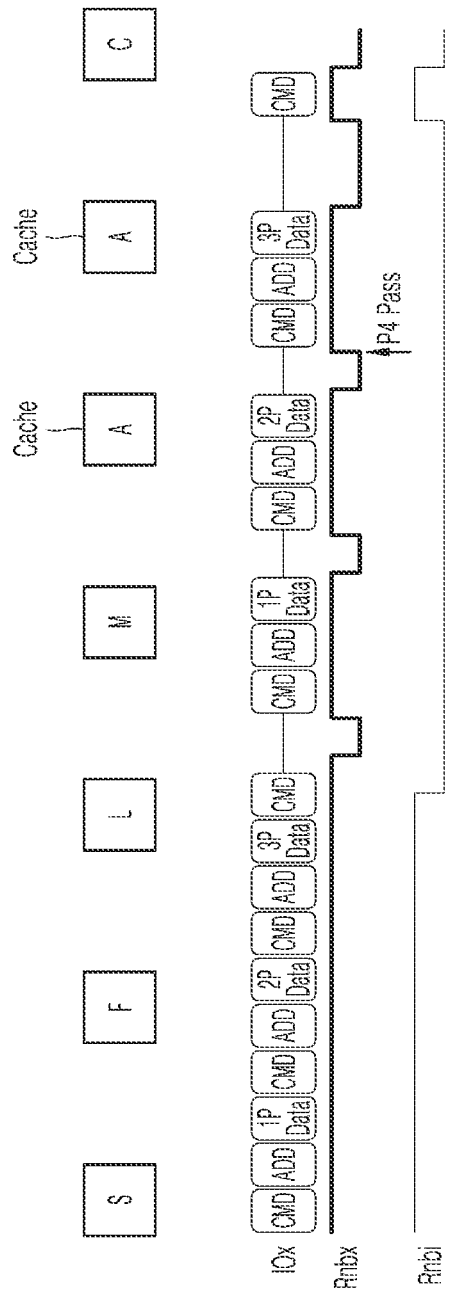
Figure 14C:
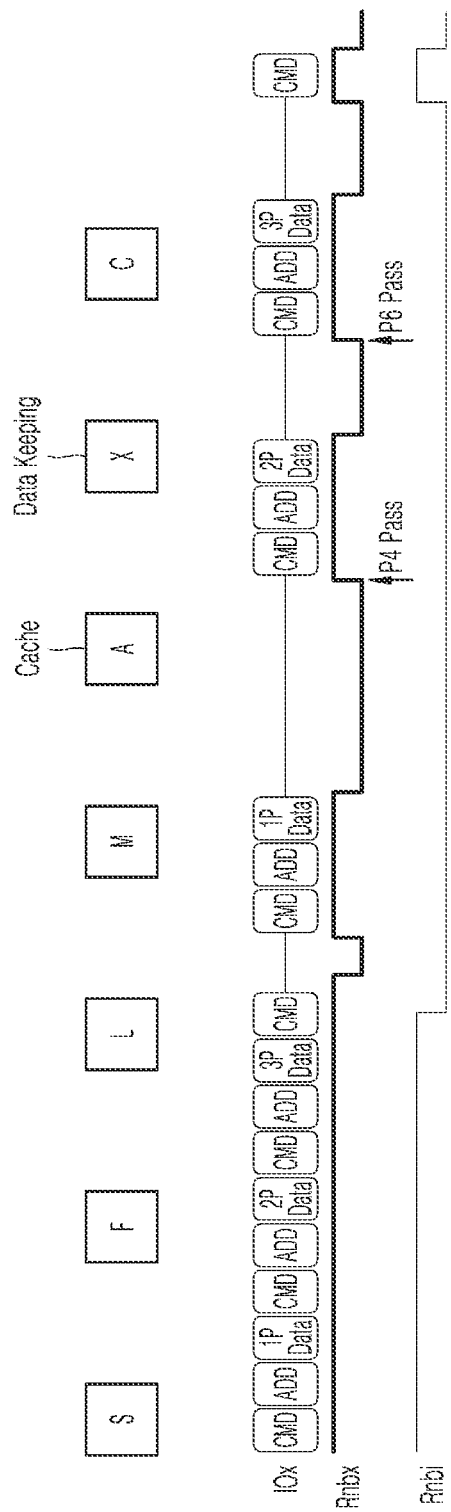
Figure 14D:
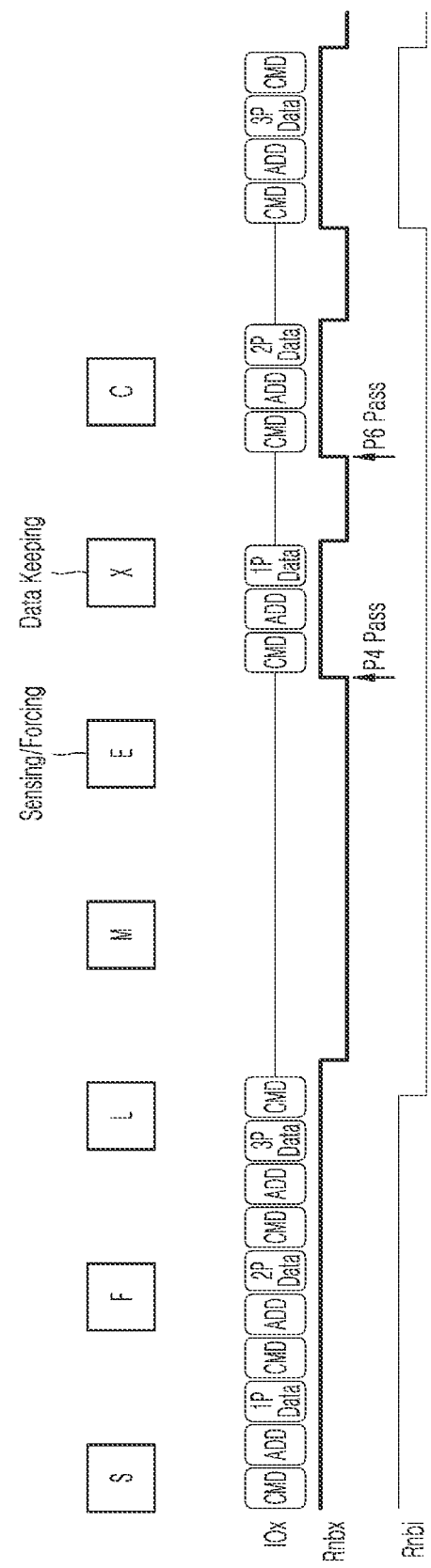
Figure 14E:
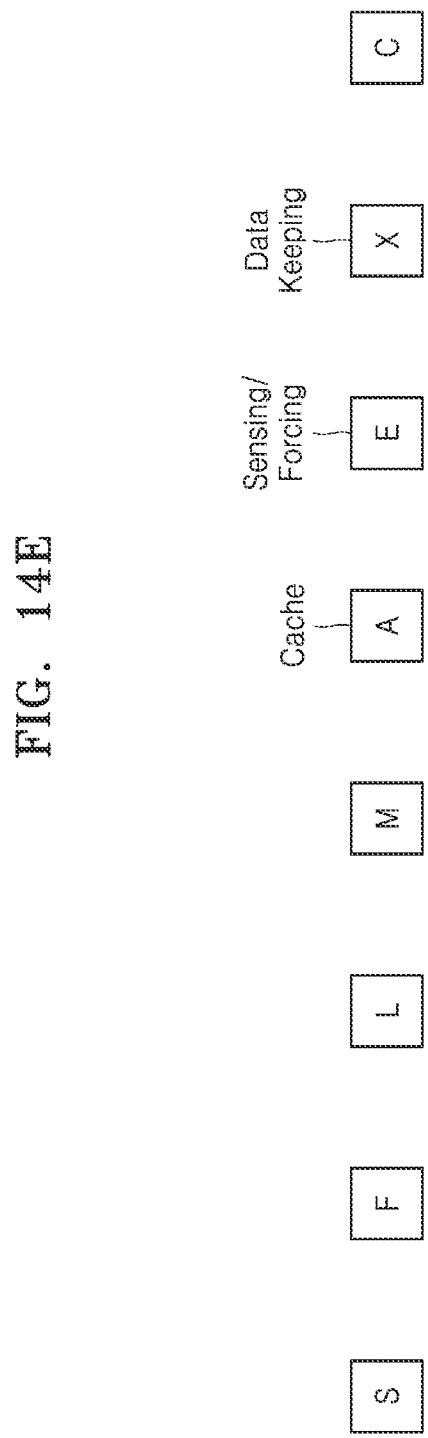
Figure 14F:
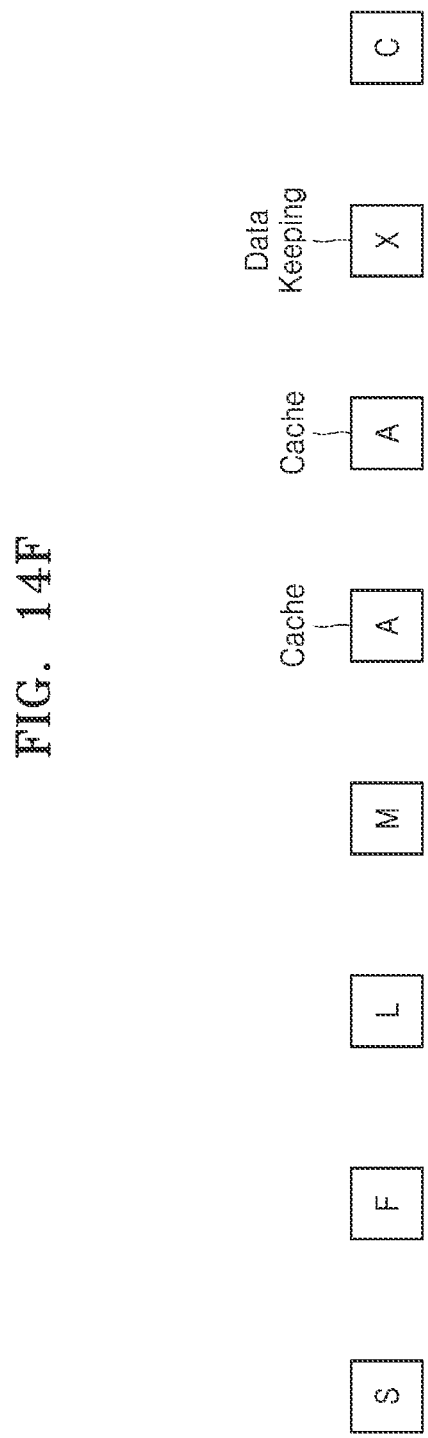

FIGS. 14A to 14G illustrate diagrams of an example where a page buffer includes a plurality of additional buffers, according to embodiments of the inventive concepts. A case where two additional latches are provided is illustrated in FIGS. 14A to 14D, a case where three additional latches are provided is illustrated in FIGS. 14E and 14F, and a case where four additional latches are provided is illustrated in FIG. 14G. Also, for convenience of explanation, an additional latch for caching among additional latches may be referred to as a first additional latch A, an additional latch for sensing/forcing may be referred to as a second additional latch E, and an additional latch for keeping data may be referred to as a third additional latch X. Also, a memory device may receive a command CMD, an address ADD, and pieces of data 1P Data to 3P Data from a memory controller (not shown), output a ready/busy signal Rnbx to the memory controller, and generate an internal ready/busy signal Rnbi. Also, the memory device may receive data to be programmed next after programming of a threshold voltage distribution P4 and programming of a threshold voltage distribution P6 are completed.

Referring to FIG. 14A, as one first additional latch A and one second additional latch E are included in a page buffer, a full cache function may be performed, and thus, pieces of data 1P Data to 3P Data to be programmed next may be received while a current program operation is being performed. Also, the second additional latch E may be used as a sensing latch, or may be used as a forcing latch.

Also, referring to FIG. 14B, as two first additional latches A are included in a page buffer, first and second data 1P Data and 2P Data to be programmed next may be received immediately after current programming starts.

Also, referring to FIG. 14C, as one first additional latch A and one third additional latch X are included in a page buffer, a full cache function may be performed, and thus, pieces of data 1P Data to 3P Data to be programmed next may be received while a current program operation is being performed. Also, as the third latch X is used for keeping data, pieces of data 1P Data to 3P Data currently programmed may be temporarily stored in the page buffer until a current program operation is completed.

Also, referring to FIG. 14D, as one second additional latch E and one third additional latch X are included in the page buffer, first and second data 1P Data and 2P Data to be programmed next may be received while a current program operation is being performed, and the other third data 3P Data may be received after a current program operation is completed. Also, as the one second additional latch E and the one third additional latch X are included in the page buffer, a latch for sensing/forcing may be added, and moreover, the pieces of data 1P Data to 3P Data currently programmed may be temporarily stored in the page buffer until a current program operation is completed.

Moreover, referring to FIG. 14E, as one first additional latch A_LAT, one second additional latch E, and one third additional latch X are included in the page buffer, a full cache function may be performed, a latch for sensing/forcing may be added, and pieces of data 1P Data to 3P Data currently programmed may be temporarily stored in the page buffer until a current program operation is completed. Moreover, referring to FIG. 14F, as two first additional latches A_LAT and one third additional latch X are included in the page buffer, a full cache function may be performed, and pieces of data 1P Data to 3P Data currently programmed may be temporarily stored in the page buffer until a current program operation is completed. Also, first and second data 1P Data and 2P Data to be programmed next may be received immediately after current programming starts, and the other third data 3P Data may be received after programming of a threshold voltage distribution P4 is completed.

Moreover, referring to FIG. 14G, as two first additional latches A_LAT, one second additional latch E, and one third additional latch X are included in the page buffer, a full cache function may be performed, a latch for sensing/forcing may be added, and pieces of data 1P Data to 3P Data currently programmed may be temporarily stored in the page buffer until a current program operation is completed. Also, first and second data 1P Data and 2P Data to be programmed next may be received immediately after current programming starts, and the other third data 3P Data may be received after programming of a threshold voltage distribution P4 is completed.

The elements illustrated in FIGS. 14A to 14G show example implementation embodiments of the page buffer. However, the page buffer according to other example embodiments may include a various number of different latches and may be used for various purposes on the basis of a setting of a memory device.

Figure 15:
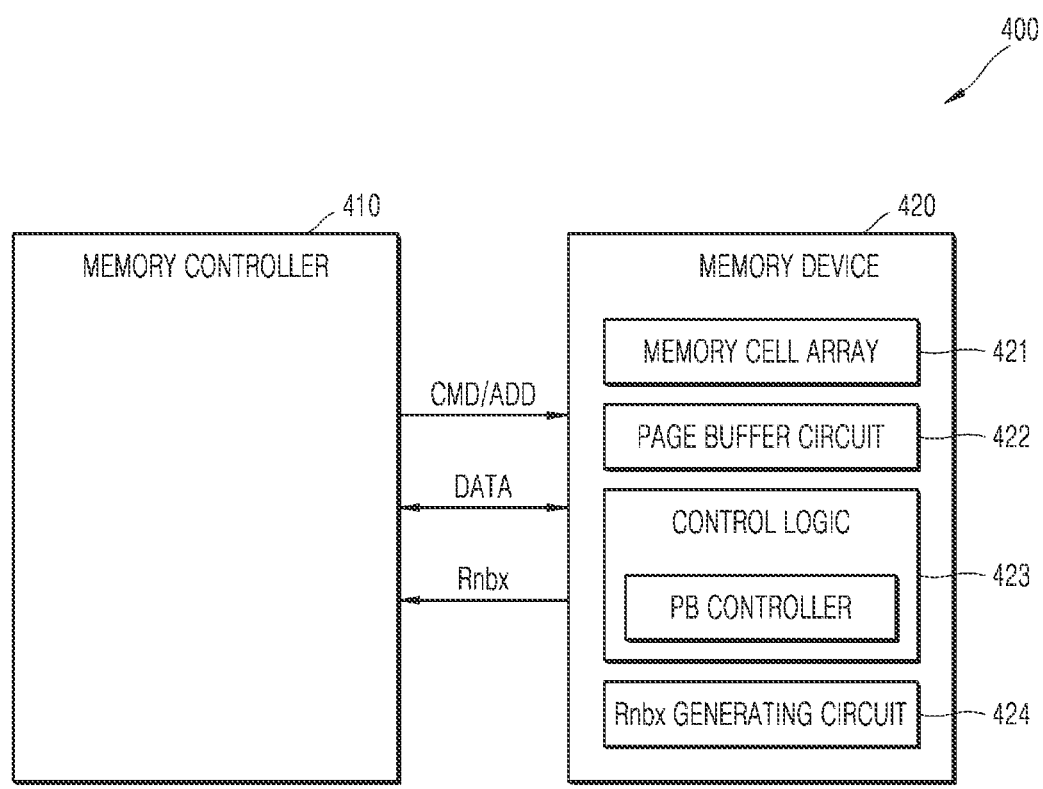
FIG. 15 illustrates a block diagram of a memory system according to embodiments of the inventive concepts.

FIG. 15 illustrates a block diagram of a memory system 400 according to embodiments of the inventive concepts.

Referring to FIG. 15, the memory system 400 may include a memory controller 410 and a memory device 420. The memory device 420 may include a memory cell array 421, a page buffer circuit 422, a control logic 423 (e.g., a control logic circuit), and a ready/busy signal generating circuit 424. The control logic 423 may include a page buffer (PB) controller.

The memory system 400 may communicate with a host through various interfaces, and for example, the memory system 400 may communicate with the host through various interfaces such as universal serial bus (USB), multimedia card (MMC), embedded MMC (eMMC), peripheral component interconnection (PCI), PCI-express (PCI-E), advanced technology attachment (ATA), serial-ATA, parallel-ATA, small computer small interface (SCSI), enhanced small disk interface (ESDI), integrated drive electronics (IDE), Firewire, universal flash storage (UFS), and non-volatile memory express (NVMe).

According to example embodiments, the memory device 420 may correspond to the memory device described with respect to FIGS. 1-14G. In some embodiments, the memory system 400 may be implemented as a memory which is embedded into or detachably attached to an electronic device, and for example, the memory system 400 may be implemented as various types such as an embedded UFS memory device, an eMMC®, an SSD, a UFS memory card, a CompactFlash® (CF) card, a secure digital (SD®) card, a micro secure digital (microSD®) card, a mini secure digital (miniSD™) card, an extreme digital (xD) card, and a Memory Stick™ (MS). Also, the memory system 400 may be referred to as a storage device which stores data in a non-volatile manner.

The memory controller 410 may provide an address ADD, a command CMD, and a control signal CTRL to the memory device 420 to control a record operation, a read operation, and an erase operation on the memory device 420 and may transfer and receive data DATA to and from the memory device 420. Also, each page buffer of the page buffer circuit 422 may include a plurality of latches, and at least one of the plurality of latches may correspond to an additional latch according to the embodiments of the inventive concepts. The page buffer controller may include setting information associated with a purpose setting of the additional latch, and based thereon, the purpose of the additional latch may be set.

The ready/busy signal generating circuit 424 may provide the memory controller 410 with a ready/busy signal Rnbx having a waveform based on control by the control logic 423. For example, according to example embodiments, the ready/busy signal Rnbx may be changed to have various waveforms on the basis of the number and purpose of additional latches, and the ready/busy signal Rnbx having a waveform suitable for the number and purpose of additional latches may be provided to the memory controller 410.

Figure 16:
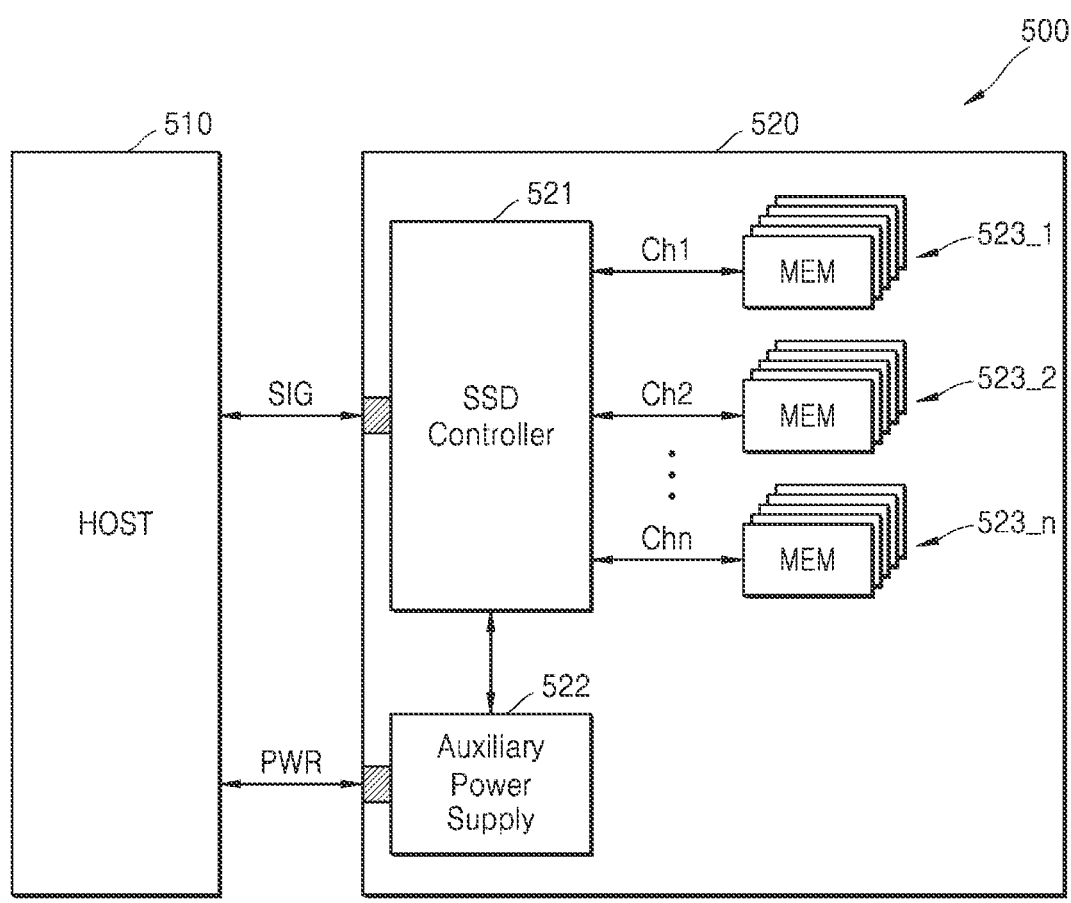
FIG. 16 illustrates a block diagram of an example where a memory device according to embodiments of the inventive concepts is applied to a solid state drive (SSD) system.

FIG. 16 illustrates a block diagram of an example where a memory device according to embodiments of the inventive concepts is applied to an SSD system 500.

Referring to FIG. 16, the SSD system 500 may include a host 510 and an SSD 520. The SSD 520 may transmit and receive a signal SIG to and from the host 510 through a signal connector and may receive power PWR through a power connector. The SSD 520 may include an SSD controller 521, an auxiliary power supply 522, and a plurality of memory devices 523_1 to 523_n. Each of the memory devices 523_1 to 523_n may include a vertical stack type NAND flash memory device. In this case, the SSD 520 may be implemented by using the embodiments described above with reference to FIGS. 1 to 15. That is, each of the memory devices 523_1 to 523_n included in the SSD 520 may include a page buffer, the page buffer may include at least one additional latch, and the purpose of the additional latch may be set. Also, based on the number and purpose of additional latches, a ready/busy signal Rnbx having different waveforms may be provided to the SSD controller 521.

While the inventive concepts have been particularly shown and described with reference to embodiments thereof, it should be understood that various changes in form and detail may be made therein without departing from the spirit and scope of the following claims.

What is claimed is:

1. A memory device comprising:
a memory cell array including a plurality of memory cells;
a page buffer circuit including a page buffer connected to the memory cell array through a corresponding bit line from among a plurality of bit lines, the page buffer including at least one additional latch and N data latches configured to store data to be programmed, wherein N is an integer of 2 or more; and
a control logic circuit configured to control a setting of the page buffer, wherein, based on a first setting corresponding to the page buffer, data programmed in a current program operation is stored in some data latches of the N data latches and the at least one additional latch, and data to be programmed in a next program operation is stored in other of the N data latches and the at least one additional latch before the current program operation is completed, and based on a second setting corresponding to the page buffer, externally provided data is not stored in the at least one additional latch in the current program operation and the next program operation.

2. The memory device of claim 1, wherein each of the plurality of memory cells comprises a triple level cell configured to store 3-bit data, and the N data latches comprise three data latches, and
3-bit data programmed in the current program operation and 1-bit data of 3-bit data to be programmed in the next program operation are stored in the three data latches and the at least one additional latch.

3. The memory device of claim 2, wherein, as programming of a bit of one of 3-bit data programmed in the current program operation is completed, another 1-bit data of the 3-bit data to be programmed in the next program operation is provided to and stored in the page buffer before the current program operation is completed.

4. The memory device of claim 3, wherein, as programming of the another 1-bit of the 3-bit data programmed in the current program operation is completed, a remaining 1-bit data of the 3-bit data to be programmed in the next program operation is provided to and stored in the page buffer before the current program operation is completed.

5. The memory device of claim 1, further comprising a ready/busy signal generating circuit configured to output a ready/busy signal,
wherein, the ready/busy signal generating circuit is configured to output the ready/busy signal representing a ready state immediately after the current program operation starts, and the memory device then receives the data to be programmed in the next program operation.

6. The memory device of claim 1, wherein the page buffer further comprises a sensing latch associated with data sensing, and a forcing latch configured to adjust a precharge voltage level of the corresponding bit line.

7. The memory device of claim 6, wherein, based on the second setting, the at least one additional latch is connected to the corresponding bit line through a sensing node to sense data stored in a corresponding memory cell from among the plurality of memory cells.

8. The memory device of claim 6, wherein, based on the second setting, the at least one additional latch is configured to store a value associated with adjusting a precharge voltage level of the corresponding bit line, and
the precharge voltage level of the corresponding bit line varies based on a value stored in the forcing latch and a value stored in the at least one additional latch.

9. The memory device of claim 6, wherein, based on the second setting, the at least one additional latch is configured to store information representing a pass or a fail of programming of the data programmed in the current program operation, and
the data programmed in the current program operation is kept in the page buffer until the current program operation is completed.

10. The memory device of claim 1, wherein the at least one additional latch comprises a plurality of additional latches, and
the data programmed in the current program operation and data of two or more bits of the data to be programmed in the next program operation are stored in the page buffer together.

11. The memory device of claim 1, wherein the at least one additional latch comprises a plurality of additional latches, and
based on a setting of the control logic, some of the plurality of additional latches are configured to store at least one piece of the data to be programmed in the next program operation, and other additional latches of the plurality of additional latches are configured to store information for adjusting a precharge voltage level of the corresponding bit line or information representing a pass or a fail of programming of the data programmed in the current program operation.

12. A page buffer of a memory device, the page buffer comprising:
a sensing latch connected to a bit line through a sensing node and configured to sense data stored in a memory cell;
a forcing latch connected to the bit line and configured to adjust a precharge voltage level of the bit line;
a first data latch and a second data latch each configured to store data which is to be programmed;
a cache latch configured to receive data from an external memory controller and transfer the received data to the first data latch or the second data latch; and
an additional latch configured to store data to be programmed based on a first setting of the memory device, and to store information for adjusting a precharge voltage level of the bit line or information representing a pass or a fail of programming of programmed data based on a second setting of the memory device.

13. The page buffer of claim 12, wherein the memory cell comprises a triple level cell configured to store 3-bit data, and
data programmed in a current program operation is stored in the first and second latches and the cache latch.

14. The page buffer of claim 13, wherein, based on the first setting, after the current program operation starts data of a first bit of 3-bit data to be programmed in a next program operation is stored in the additional latch before the current program operation is completed.

15. The page buffer of claim 14, wherein, as programming of 2 bits of 3-bit data programmed in the current program operation is completed, 2-bit data other than the first bit of the 3-bit data to be programmed in the next program operation is provided to and stored in the page buffer before the current program operation is completed.

16. The page buffer of claim 12, wherein, based on the second setting, information having a first value is stored in the additional latch when programming of data programmed in a current program operation is passed, and information having a second value is stored in the additional latch when programming of the data fails.

17. The page buffer of claim 12, wherein, based on the second setting, the precharge voltage level of the bit line varies based on a value stored in the forcing latch and a value stored in the additional latch.

18. A memory device comprising:
a memory cell array including a plurality of memory cells;
a page buffer circuit including a page buffer connected to the memory cell array through a corresponding bit line from among a plurality of bit lines, the page buffer including at least one additional latch and N number of data latches configured to store data to be programmed, wherein N is an integer of 2 or more;
a control logic circuit configured to control a program operation and a read operation on the memory cell array;
a cache operation circuit configured to control an electrical connection relationship so that the at least one additional latch operates as a cache temporarily storing data;
a sensing/forcing operation circuit configured to control an electrical connection relationship so that the at least one additional latch senses data stored in a memory cell or adjusts a precharge voltage level of the corresponding bit line; and
a program data keeping circuit configured to control an electrical connection relationship so that the at least one additional latch stores program pass/fail information and data on which current programming is performed is kept in the page buffer until a current program operation is completed,
wherein the control logic circuit is configured to output a control signal for controlling at least one of the cache operation circuit, the sensing/forcing operation circuit, and the program data keeping circuit based on setting information.

19. The memory device of claim 18, further comprising a register configured to store the setting information,
wherein, in an initial operation of the memory device, the setting information stored in the register is provided to the control logic circuit.

20. The memory device of claim 18, wherein the setting information comprises first information associated with a number of the at least one additional latch included in the page buffer and second information associated with a purpose of the at least one additional latch.

* * * * *